United States Patent [19]

Titsworth

[11] 4,311,962
[45] Jan. 19, 1982

[54] VARIABLE FREQUENCY MISSING PULSE DETECTOR

[75] Inventor: Jerry M. Titsworth, South Bend, Ind.

[73] Assignee: The Bendix Corporation, Southfield, Mich.

[21] Appl. No.: 72,388

[22] Filed: Sep. 4, 1979

[51] Int. Cl.³ .............................................. H03K 5/19
[52] U.S. Cl. .................................. 328/120; 328/136; 307/519
[58] Field of Search ....................... 307/269, 273, 519; 328/5, 120, 136; 250/571; 371/65

[56] References Cited

U.S. PATENT DOCUMENTS

| | | | |
|---|---|---|---|
| 3,204,189 | 8/1965 | Trautwein | 328/120 |
| 3,518,456 | 6/1970 | Mauduit et al. | 307/269 |
| 3,536,935 | 10/1970 | Watson, Jr. et al. | 307/273 |
| 3,569,744 | 3/1971 | Garrahan | 328/120 |
| 3,652,943 | 3/1972 | Piccirilli et al. | 328/120 |
| 3,906,232 | 9/1975 | Meihofer | 250/571 |
| 4,142,159 | 2/1979 | Ingram et al. | 328/120 |

OTHER PUBLICATIONS

Electronic Design, "Heartbeat Monitoring Circuit Provides Steady Output and a Missed-Beat Alarm", 12/20/79, pp. 82, 84.
Electronics Missing-Pulse Detector Handles Variable Frequencies by Lyles et al., vol. 52, No. 8, 4/12/79, p. 131.
Burr-Brown Specification Sheet, Voltage-to-Frequency and Frequency-to-Voltage Converter, pp. 1-5, Mar. 1978.
Fairchild Applications Handbook, 1 sheet, "Malfunction Indicator", 1973.
Signetics I. C. Book, 1 sheet, "Missing Pulse Detector", p. 653, 1972.

*Primary Examiner*—Stanley D. Miller, Jr.
*Assistant Examiner*—B. P. Davis
*Attorney, Agent, or Firm*—Leo H. McCormick, Jr.; Ken C. Decker

[57] ABSTRACT

A variable frequency missing pulse detector includes a reference signal generator comprising a series connected frequency-to-voltage converter and voltage-to-frequency converter which produces a reference signal with a frequency proportional to the average frequency of a variable frequency source. A pulse generator generates test signal pulses from the source on a cycle-by-cycle basis. A logic circuit compares the reference and test signals and produces a warning signal when a test signal fails to occur during a full cycle of the reference signal.

9 Claims, 2 Drawing Figures

VARIABLE FREQUENCY MISSING PULSE DETECTOR

BACKGROUND OF THE INVENTION

This invention relates to a circuit arrangement for detecting missing pulses in a variable frequency source.

It is often necessary to monitor a frequency source in a frequency sensitive system, such as a motor control system, wherein it is desirable to perform some control operation within the time frame of a single period of the frequency source. Missing pulse detectors have been used for this purpose to detect the absence of a pulse in a frequency source. However, typical missing pulse detection circuits have been disadvantaged with respect to the range of source frequencies over which they are capable of operating. For example, detectors which generate a delayed reference pusle in response to an input source pulse cannot operate unless the delay time corresponds to the period of the source signal. Thus, such a detector can operate only over a narrow range of source frequencies. Similarly, a heart-beat monitoring system using a rate matching technique has a limited frequency response because of instabilities which result if the souce frequency is less than one-half of the inverse of the system response time. Another type of missing pulse detection circuit utilizes a frequency doubler with a variable period retriggerable one-shot. The disadvantages of such a circuit are reduced frequency response due to the frequency doubler and temperature instabilites due to the one-shot R-C timing circuit elements.

SUMMARY OF THE INVENTION

An advantage of the present invention, is that it provides a missing pulse detection circuit which is capable of detecting missing pulses in a frequency source whose frequency varies over a range of at least six decades.

Another advantage of this invention is that it provides means for generating a reference signal with a frequency proportional to the average frequency of the variable frequency source, and which is substantially insensitive to individual missing cycles of the variable frequency source.

Another advantage of this invention is that it provides a variable frequency missing pulse detector with considerable temperature stability.

Another advantage of this invention is that it provides a variable frequency missing pulse detector using currently available, low cost components.

These advantages are achieved according to the applicant's invention in that there is provided an improved missing pulse retector circuit for detecting a loss of signal from a variable freqency signal. The circuit includes a monostable or pulse forming circuit which produces a test pulse signal in response to individual cycles of the variable frequency signal, but which produces no test pulse when a cycle of the variable frequency signal is missing. The circuit also includes logic circuitry which compares the test signal to a reference signal and produces a warning signal when no test signal occurs during a full cycle of the reference signal. The invention also provides a reference signal generator, which, in response to the variable frequency signal, generates the reference signal with a frequency substantially proportional to the average frequency of the variable frequency signal. The reference signal is also substantially insensitive to individual missing cycles of the variable frequency signal. The reference signal generator includes a frequency-to-voltage converter connected in series with a voltage-to-frequency converter, whose output, the reference signal, is then compared to the test signal by the logic circuitry.

DETAILED DESCRIPTION

Figure 1:
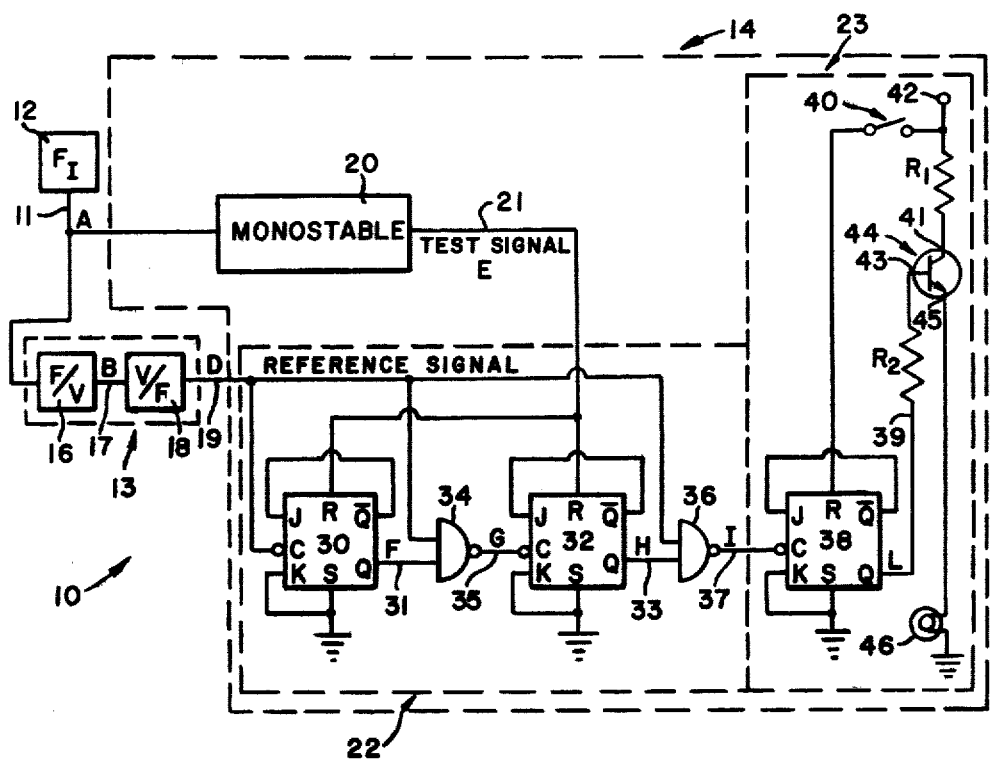
FIG. 1 is a schematic diagram of applicant's missing pulse detector circuit.

A test circuit 10 for detecting a missing pulse in a variable frequency signal A generated at 11 by a variable frequency source 12 includes a reference signal generator 13 and a warning circuit 14. The reference signal generator 12 includes a frequency-to-voltage converter 16 and a voltage-to-frequency converter 18 connected in series. Converters 16 and 18 are available as standard off-the-shelf items. Such converters can provide a frequency response of up to 10 or 100 KHz and can be adapted for either frequency-to-voltage or voltage-to-frequency conversion, as described in their specification literature. Such converters also provide applicant's circuit with a high degree of the temperature stability. The input of frequency-to-voltage converter 16 receives the variable frequency signal A. Frequency-to-voltage converter 16 produces an analog output DC voltage B at 17 with an amplitude substantially proportional to the average frequency of the variable frequency signal A. The amplitude of voltage B is proportional to the average frequency of the variable frequency signal A due to the inherent response time limitation caused by the integrating capacitor (not shown) contained within the converter 16. The output voltage B of converter 16 is applied to the input terminals of voltage-to-frequency converter 18. Converter 18 produces reference signal D at 19 as a train of constant amplitude, constant width pulses whose repetition rate or frequency is proportional to the amplitude of the voltage B applied to the input terminals of converter 18. Since the frequency of reference signal D is proportional to voltage B, and voltage B is proportional to the average frequency of variable frequency signal A, frequency of reference signal D is therefore porportional to the average frequency of the variable frequency signal A. Reference signal D is also, therefore, substantially insensitive to small numbers of lost or missing cycles of variable frequency signal A. For example, a lost cycle of signal A will cause a small reduction in the frequency of reference signal D, but will not cause the absence of a full cycle of reference signal D.

Figure 2:
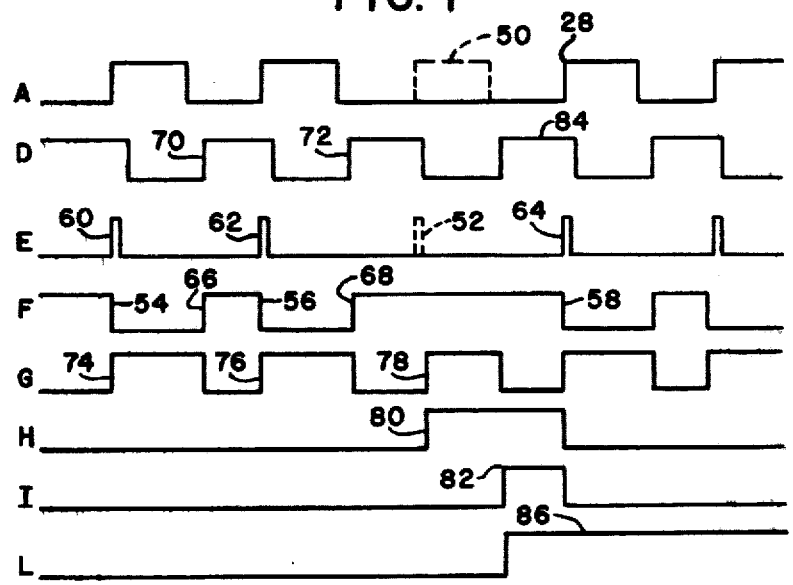
FIG. 2 is a graph showing waveforms generated at various points in the circuit according to FIG. 1.

Warning circuit 14 includes a monostable or pulse forming circuit 20, logic circuit 22 and output circuit 23. Monostable or pulse forming circuit 20 receives the variable frequency signal A and produces an output pulse or test signal E at 21 of a predetermined pulse width for each low-to-high transition of the variable frequency signal A. As shown in FIG. 2, if a cycle of signal A is missing, such as at 50, then no pulse of test signal E is generated, as at 52, until the source signal A reappears, as at 28. In this manner, the test signal E is sensitive to missing cycles of the variable frequency signal A on a cycle-to-cycle basis and the repetition rate of the test signal E is substantially equivalent to the frequency of the variable frequency signal A.

Logic circuit 22 includes bistable logic elements 30 and 32, NAND gate 34 and AND gate 36. Dual J-K type flip-flops are suitable for use as bistable logic elements 30 and 32, however, other types of flip-flop devices could be used as well. Flip-flops of the dual J-K type include forcing inputs J and K, inverting trigger input C, set S and reset R inputs, and complimentary Q and $\bar{Q}$ outputs. The forcing K inputs and the set S inputs are connected to ground potential and are therefore held at a low level while the J inputs are connected to the $\bar{Q}$ outputs. With flip-flops 30 and 32 connected in this manner, a low-to-high transition applied to the inverting trigger input C causes the Q output to assume a "logic 1" or high level state, and a low-to-high transition applied to the reset R input causes the Q output to assume a "logic 0" or low level state, while the $\bar{Q}$ output assumes a high level state. In this reset condition, with the $\bar{Q}$ output high and tied to the J input, the Q and $\bar{Q}$ outputs toggle or change states in response to a signal applied to the trigger C input. In this toggled state the Q output is high, the $\bar{Q}$ output is low and the J and K inputs are therefore both low. With both J and K inputs low, the Q and $\bar{Q}$ outputs of the flip-flops latch or remain in this state until a pulse or a signal is applied to the reset R input. However, when pulses are applied to both the trigger C and the reset R inputs, the reset input "overrides" the trigger input, thus forcing the Q output low, despite the application of a trigger input.

As shown in FIG. 1, the reference signal D is applied to the inverting trigger input C of flip-flop 30, to an input of NAND gate 34 and to an input of AND gate 36. The test signal E is applied to the reset R inputs of both flip-flops 30 and 32. The Q output F at 31 of flip-flop 30 is connected to the other input of NAND gate 34 whose output G at 35 is, in turn, connected to the inverting trigger input C of flip-flop 32. The Q output H at 33 of flip-flop 32 is connected to the other input of AND gate 36.

Output circuit 23 includes another J-K type flip-flop 38 with S, J, and K inputs and a $\bar{Q}$ output coupled in the same manner as are corresponding terminals of flip-flops 30 and 32 previously described. The inverting trigger C of flip-flop 38 receives the output 1 at 37 of NAND gate 36. Reset R input of flip-flop 38 is connected to one terminal of switch 40 or other voltage switching device, the other terminal of which is connected to a DC voltage supply 42 and which is connected through resistor R1 to the collector 41 of transistor 44. The base 43 of transistor 44 is connected through resistor R2 to the Q output 39 of flip-flop 38. The emitter 45 of transistor 44 is connected through lamp or warning device 46 to ground.

MODE OF OPERATION

Referring to FIG. 2, assume that missing cycle 50 of signal A is the only missing cycle in a relatively long train of cycles of variable frequency signal A. Then, FIG. 2 shows a typical reference signal D which could be generated at 19 by reference signal generator 13 in response to such a signal A. It should be noted that reference signal D does not miss a cycle even though cycle or pulse 50 of signal A is missing. At the same time, test signal E, with a missing pulse 52 corresponding to the missing cycle 50, is generated by monostable 20 as shown in FIG. 2. Now, the reset input R of flip-flop 30 receives test signal E and the inverted trigger input C of flip-flop 30 receives the reference signal D. Thus, the Q output F of flip-flop 30 is forced low as at 54, 56 and 58 by pulses 60, 62, and 64 of test signal E. Conversely, the Q output F of flip-flop 30 is forced high, as at 66 and 68, by the low-to-high transitions 70 and 72 of reference signal D.

The output G of NAND gate 34, which receives reference signal D and Q output F, is a "logic 1" unless both reference signal D and output F are high, as shown in FIG. 2. Ouptut G of NAND gate 34 is applied to the inverting trigger input C of flip-flop 32. The low-to-high transitions of output G as at 74, 76 and 78, force the Q output H of flip-flop 32 high unless the test signal E pulses are simultaneously applied to the reset input R of flip-flop 32, as at 60 and 62. The low-high transitions of ouptut G of NAND gate 34 are slighty delayed with respect to the leading edge of the pulses of test signal E because of delays caused by flip-flop 30 and NAND gate 34. Therefore, the predetermined pulse width of the pulses of test signal E must be long enough to insure that these pulses are applied to the reset input R of flip-flop 32 to prevent the slightly delayed low-to-high transistions of output G of NAND gate 34 from causing a low-to-high transition of Q output H of flip-flop 32. Thus, as long as there is no missing cycle of signal A or test signal E, the Q ouput H of flip-flop 32 will remain low. However, upon occurrence of missing pulses of signals A and E, as at 50 and 52, then the Q output H of flip-flop 32 will be forced high, as at 80, by the low-to-high transition 78 of output G of NAND gate 34.

AND gate 36 receives the Q output H of flip-flop 32 and the reference signal D. The output 1 of AND gate 36 is "logic 0" or low unless both of its input signals D and H are high, as at 82. Since signal H is high only when a cycle of signal A is missing, it follows that output 1 is high, as at 82, only when both a cycle of signal A is missing and when reference signal D is high, as at 84. The low-to-high transition of output 1, as at 82, is transmitted to the inverting trigger input C of flip-flop 38, and this transition forces the Q output L at 39 of flip-flop 38 high, as at 86, to turn on transistor 44, and thus activate the warning lamp 46. Flip flop 38 allows transistor 44 and lamp 46 to remain activated until switch 40 is closed. Momentarily closing switch 40 resets the output Q of flip-flop 38 low, so that the circuit 10 is once again ready to sense a missing cycle of variable frequency signal A. The typical 6 decade dynamic range of the converters 16, 18, makes detector operation possible over a similar wide frequency range of variable frequency signal A. Since the frequency of reference signal D tracks the average frequency of the variable frequency signal A, the reference generator 13, and the detector circuit 10 is capable of operating continuously and automatically as the frequency of the variable frequency signal A varies.

I claim:

1. A missing pulse detector for detecting a loss of signal from a variable frequency source, comprising:
   reference signal generator means responsive to said variable frequency source signal for generating a reference signal having a frequency proportional to the average frequency of said variable frequency signal, said reference signal generator means being substantially insensitive to the lost cycle of said variable frequency source signal, said reference signal generator means including a frequency-to-voltage converter and a voltage-to-frequency converter connected in series, one of said converters receiving said source signal, said reference signal being an output of the other of said converter means for generating non-delayed test pulses in response to cycles of said variable frequency source signal and with a repetition rate substantially equivalent to the frequency of the variable frequency source signal; and warning circuit means responsive to said test pulses and to said reference signal for producing a warning signal in response to a loss of said variable frequency source signal.

2. The missing pulse detector of claim 1, wherein said warning circuit comprises:

a first bistable device having an output with a first state triggered by the reference signal and with a second state triggered by the test signal;

first gate means for producing an output signal unless the reference signal and the output of the first bistable device are in a selected state;

a second bistable device having an output with a first state triggered by the output signal of the first gate means and with a second state triggered by the test signal; and second gate means for producing said warning signal when the reference signal and the output of the second bistable device are in a selected state.

3. The missing pulse detector of claim 1, wherein said test pulse generating means comprises monostable means for generating a test signal in response to a predetermined condition of the variable frequency source signal.

4. The missing pulse detector of claim 3, wherein said warning circuit means comprises bistable means and gate means coupled to said reference signal and to said test pulses for producing said warning signal upon the loss of said variable frequency source signal.

5. The missing pulse detector of claim 4, wherein:

said frequency-to-voltage converter receives said variable frequency source signal, said reference signal being an output of said voltage-to-frequency converter.

6. A missing pulse detector for detecting a loss of signal from a variable frequency source, comprising:

reference signal generator means responsive to said variable frequency source signal for generating a reference signal having a frequency proportional to the average frequency of said variable frequency source signal, said reference signal generator means being substantially insensitive to a lost cycle of said variable frequency source signal;

means for generating non-delayed test pulses in response to cycles of said variable frequency source signal and with a repetition rate substantially equivalent to the frequency of the variable frequency source signal, said test pulse generating means including monstable means for generating a test signal in response to a predetermined condition of the variable frequency source signal; and warning circuit means responsive to said test pulses and to said reference signal for producing a warning signal in response to a loss of said variable frequency source signal, said warning circuit means including bistable means and gate means coupled to said reference signal and to said test pulses for producing said warning signal upon the loss of said variable frequency source signal.

7. The missing pulse detector of claim 6, wherein said bistable means and gate means comprise:

a first device having an output with a first state triggered by the reference signal and with a second state triggered by the test signal;

a NAND gate for producing an output signal unless the reference signal and the output of the first device are in a selected state;

a second device having an output with a first state triggered by the output signal of said NAND gate and with a second state triggered by the test signal; and an AND gate for producing said warning signal when the reference signal and the output of the second device are in a selected state.

8. A method of detecting a loss of signal from a variable frequency source, which comprises:

generating in response to said variable frequency source signal a reference signal having a frequency proportional to the average frequency of said source signal;

applying said variable frequency source signal to an input of one converter of a unit comprising a frequency-to-voltage converter and a voltage-to-frequency converter connected in series, said converters cooperating to generate said reference signal at an output of the other converter of said unit;

generating non-delayed test pulses in response to cycles of said variable frequency source signal unless a cycle of said source signal is missing, said test pulses having a repetition rate substantially equivalent to the frequency of said source signal; and comparing said test signal to said reference signal to detect a loss of said source signal.

9. A method of detecting a loss of signal from a variable frequency source, which comprises:

generating in response to said variable frequency source signal a reference signal having a frequency proportional to the average frequency of said source signal;

converting said variable frequency source signal to an analog voltage proportional to the average frequency of said source signal by means of a frequency-to-voltage converter; and converting said analog voltage by means of a voltage-to-frequency converter to a reference signal having a frequency proportional to said analog voltage, said converters cooperating so that the frequency of said reference signal is proportional to the average frequency of said variable frequency source signal;

generating non-delayed test pulses in response to cycles of said variable frequency source signal unless a cycle of said source signal is missing, said test pulses having a repetition rate substantially equivalent to the frequency of said source signal; and comparing said test signal to said reference signal to detect a loss of said source signal.

* * * * *